(12) United States Patent
Satoh et al.

(10) Patent No.: US 6,219,289 B1
(45) Date of Patent: Apr. 17, 2001

(54) DATA WRITING APPARATUS, DATA WRITING METHOD, AND TESTER

(75) Inventors: Kazuhiko Satoh; Shigeo Tsuchida, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/533,734

(22) Filed: Mar. 23, 2000

Related U.S. Application Data

(60) Provisional application No. 60/125,715, filed on Mar. 23, 1999.

(51) Int. Cl.[7] .................................................. G11C 7/00
(52) U.S. Cl. ...................... 365/201; 365/185.33; 365/236
(58) Field of Search .............................. 365/201, 189.07, 365/189.01, 185.33, 236; 714/738, 718

(56) References Cited

U.S. PATENT DOCUMENTS 5,862,088 * 1/1999 Takemoto et al. .................... 365/201

* cited by examiner

Primary Examiner—David Nelms
Assistant Examiner—David Lam
(74) Attorney, Agent, or Firm—Pillsbury Winthrop LLP

(57) ABSTRACT

A data writing apparatus for writing data to a plurality of electric devices, comprising: a pattern memory which stores a plurality of said data to be written to at least one of said electric devices; an ALPG and an address selector which output said plurality of said data sequentially from said pattern memory; a plurality of registers in a data writing controller which store sequence numbers, each indicating at least one of said electric devices; a counter in the data writing controller which counts times of said data being output sequentially; and a data writing control circuit which enables said one of said electric devices indicated by said sequence number that is equal to said times, to write said data.

21 Claims, 8 Drawing Sheets

| BIT | NUMBER OF DUT | MASKED DATA |
|---|---|---|
| 000 | 8 | cnt6-3 |
| 001 | 16 | cnt6-4 |
| 010 | 32 | cnt6-5 |
| 011 | 64 | cnt6 |
| 100 | 128 | - |

*FIG. 5*

DATA WRITING APPARATUS, DATA WRITING METHOD, AND TESTER

This patent application claims priority based on a U.S. provisional patent application, No. 60/125,715 filed on Mar. 23, 1999, the contents of which are incorporated herein by reference.

BACKGROUND OF THE INVENTION

1. Field of Invention

The present invention relates to a data writing apparatus, a data writing method and a tester which write data to an electric device such as a semiconductor device, and more particularly, to a data writing apparatus, a data writing method and a tester which write data to a plurality of electric devices.

2. Description of Related Art

A conventional tester for testing semiconductor devices such as memory, CPU and the like have a measurement functionality for testing the multiple same semiconductor devices simultaneously. In the conventional tester with such a functionality, an electric test is performed by inputting the same data to the same pin of the devices under testing.

FIG. 1 illustrates the structure of the conventional tester. The tester 100 comprises a pattern generator 101, a pin data selector 103, a waveform formatter 105 and a device contactor 107. The pattern generator 101 comprises an algorithmic pattern generator (ALPG) 109, an address selector 111, a pattern memory 113 and an selector 114. The algorithmic pattern generator 109 outputs control signals and address signals according to given rules. Furthermore, ALPG 109 can output data according to given rules. The address selector 111 selects an address of the pattern memory 113, according to the address signal from the algorithmic pattern generator 109. The pattern memory 113 stores data to be written to each device under testing (DUT), and outputs data corresponding to the address selected by the address selector 111. The selector 114 selects data output from the ALPG 109 or the pattern memory 113 and outputs the data to the pin data selector 103.

The pin data selector 103 comprises a WE (write enable) pattern selector 115, an address pattern selector 117 and a data pattern selector 119. The WE pattern selector 115 selects an WE pattern from the control signals being output by the pattern generator 101 and outputs the pattern to the waveform formatter 105. The address pattern selector 117 selects an address pattern from the address signals being output by the pattern generator 101 and outputs the pattern to the waveform formatter 105. The data pattern selector 119 selects data being output by the pattern memory 113 in the pattern generator 101 or the ALPG 109, and outputs data to the waveform formatter 105.

The waveform formatter 105 comprises a WE pattern formatter 121, an address pattern formatter 123 and a data pattern formatter 125. The WE pattern formatter 121 formats the waveform of the WE pattern into a given format and outputs the pattern to the input terminals of the device contactor 107 to which the pins of DUTs to receive the WE pattern contact. The address pattern formatter 123 formats the waveform of the address pattern into a given format and outputs the pattern to the input terminals of the device contactor 107 to which the pins of DUTs to receive the address pattern contact. The data pattern formatter 125 formats the waveform of the data pattern into a given format and outputs the pattern to the input terminals of the device contactor 107 to which the pins of DUTs to receive the data pattern contact. The device contactor 107 enables each pattern being output from the waveform formatter 105 to be input to the specific pins of multiple DUTs which contacs to the device contactor 107.

In this tester, the ALPG 109 in the pattern generator 101 outputs control signals and address, and the ALPG 109 or the pattern memory 113 outputs data to be written to DUTS. Then, the pin data selector 103 selects the patterns stated above from control signals, addresses and data, and outputs the patterns to the waveform formatter 105. The waveform formatter 105 formats each of the patterns into a given format and inputs it to the specific pins of DUTs which contact to the device contactor 107 simultaneously via the device contactor 107. Therefore, the same data can be written into a plurality of the same DUTs.

Recently, semiconductor devices, such as a flash memory, an LSI (Large-scale integrated circuit) having flash memories, a CPU (central processing unit) and the like, have a unique identification information to distinguish between the devices. For this reason, it is necessary to write different information for each of the devices, even though for the same type of devices.

To better explain the problem of the conventional tester, assume that different information is written to each of semiconductor devices, using the above conventional tester. If the pattern memory 113 stores data to be written to each one of DUTs, the conventional tester can output different data for each one of DUTs. However, if multiple DUTs contact to the device contactor 107, the same data will be written to the multiple DUTs. Therefore, in order to write different data for each one of DUTs, for instance, only a DUT to which data is written must contact to the device contactor 107, while other DUTs must be released from the device contactor 107.

FIG. 2 illustrates the timing chart when different data is written to each one of DUTs, using the conventional tester. FIG. 2 is the timing chart when different data is written to each one of flash memories as an example of DUT. The flash memory herein inputs to the specific pin the supplied program as a control signal to execute a write command when a write enabling signal is active (low in this example), then writes the supplied data to the supplied address of the flash memory, when a write enabling signal is active. Furthermore, the flash memory confirms the completion of writing data by polling.

As shown in FIG. 2, the conventional tester must execute the data writing process to DUT#2 after completing the data writing process to DUT#1. Thus, the data writing process for each one of DUTs must be executed sequentially. Therefore, it yields a problem that it takes a long time to write different data into multiple DUTs.

On the other hand, assuming writing different data simultaneously to each one of DUTs, it is necessary to provide the structure for simultaneously generating multiple test patterns to be input to each one of DUTs, and also provide multiple signal paths to input each test pattern to each one of DUTs. As a result, the tester becomes larger in scale and costs more.

SUMMARY OF THE INVENTION

Therefore, it is an object of the present invention to overcome these drawbacks in the prior art, and to provide a data writing apparatus, a data writing method, and a tester to write data to a plurality of electric devices easily and in a short time. This object is achieved by combinations described in the independent claims. The dependent claims define further advantageous and exemplary combinations of the present invention.

In order to achieve the object, a data writing apparatus according to the first embodiment of the present invention is a data writing apparatus for writing data to a plurality of electric devices, comprising: a data storing unit which stores a plurality of the data to be written to at least one of the electric devices; a data generating unit which outputs the plurality of the data sequentially from the data storing unit; a data sequence number storing unit which stores sequence numbers, each indicating at least one of the electric devices; a counter which counts times of the data being output sequentially from the data generating unit; and a data writing control unit which enables one of the electric devices indicated by the sequence number that is equal to the times counted by the counter, to write the data.

The data writing apparatus may further comprise a sequence number setting unit which sets the sequence number to the data sequence number storing unit. The data generating unit may output the data sequentially according to a given base clock; and the counter may count times of the data being output sequentially according to the base clock.

The data writing apparatus may further comprise a sequential output pattern output unit which outputs a sequential output pattern indicating whether to write each of the data to one of the electric devices or to all of the electric devices, wherein the counter counts times of the data when the sequential output pattern indicates that the data is output sequentially.

The data writing apparatus may further comprise a parallel supply unit which supplies the data to a plurality of the electric devices in parallel. The electric devices may have a nonvolatile data memory which retains written data. The data memory may be a flash memory.

Furthermore, the electric devices may input a write enabling signal; and the data writing control unit activates the write enabling signal supplied to the electric device indicated by the sequence number that is equal to the times, and enables the electric device to write the data. The electric devices may input a chip selecting signal; and the data writing control unit activates the chip selecting signal supplied to the electric device indicated by the sequence number that is equal to the times, and enables the electric device to write the data.

A data writing apparatus according to the second embodiment of the present invention is a data writing apparatus for writing data to a plurality of electric devices, according to a write enabling signal and/or a chip selecting signal following a write command to write the data, comprising: a data storing unit which stores a plurality of the data; a write command supply unit which supplies the write command to the plurality of the electric devices simultaneously; a data generating unit which outputs the data sequentially from the data storing unit, after the write command is supplied to the plurality of the electric devices; a data writing control unit which consecutively enables a group of the electric devices to write the data by selectively activating the write enabling signals and/or the chip selecting signals supplied to the group of the electric devices.

A data writing method according to an embodiment of the present invention is a data writing method for writing data to a plurality of electric devices, comprising: generating data sequentially to be written to at least one of the electric devices; storing sequence numbers, each indicating at least one of the electric devices; counting times of the data generated sequentially; and controlling data writing by enabling the one of the electric devices indicated by the sequence number that is equal to the times counted by the counter, to write the data.

A tester according to the first embodiment of the present invention is a tester having a pattern generating unit which generates a test pattern to be input to a plurality of electric devices and an expected pattern to be output from the plurality of the electric devices, a pin data selector which sets the test pattern generated from the pattern generating unit in accordance with pin alignment of electric terminals of the electric devices, a waveform formatter which formats the test pattern output from the pin data selector, a device contactor which provides the test pattern formatted by the waveform formatter to the plurality of the electric devices and receives an output signal from the electric devices, and a comparator which compare the output signal output from the device contactor with the expected pattern, said test pattern including data to be written to at least one of the electric devices and a control signal which controls behavior of the electric device, said pattern generating unit outputting the test patterns sequentially, said tester comprising: a data sequence number storing unit which stores sequence numbers, each indicating at least one of the electric devices; a counter which counts times of the data being output sequentially from the pattern generating unit; and a data writing control unit which enables the one of the electric devices indicated by the sequence number that is equal to the times counted by the counter, to write the data.

The tester may further comprise a sequence number setting unit which sets the sequence number to the data sequence number storing unit. The pattern generating unit may output the data sequentially according to a given base clock; and the counter counts times of the data being output sequentially according to the base clock.

The tester may further comprise a sequential output pattern output unit which outputs a sequential output pattern indicating whether to write each of the data to one of the electric devices or to all of the electric devices, wherein the counter counts times of the data when the sequential output pattern indicates that the data is output sequentially.

The tester may further comprise a parallel supply unit which supplies the data in the test pattern to the plurality of the electric devices in parallel. The electric devices may have a nonvolatile data memory which retains written data. The data memory may be a flash memory.

Furthermore, the test pattern may include a plurality of write enabling signals, each of which is supplied to one of the electric devices; and the data writing control unit may activate the write enabling signal that is supplied to the electric device indicated by the sequence number that is equal to the times counted by the counter, and enable the electric device to write the data. The test pattern may include a plurality of chip selecting signals, each of which is supplied to one of the electric devices; and the data writing control unit may activate the chip selecting signal that is supplied to the electric device indicated by the sequence number that is equal to the times counted by the counter, and enable the electric device to write the data.

A tester according to the second embodiment of the present invention is a tester having a pattern generating unit which generates a test pattern to be input to a plurality of electric devices and an expected pattern to be output from the plurality of the electric devices, a pin data selector which sets the test pattern generated from the pattern generating unit in accordance with pin alignment of electric terminals of the electric devices, a waveform formatter which formats the test pattern output from the pin data selector, a device contactor which provides the test pattern formatted by the waveform formatter to the plurality of the electric devices and receives an output signal from the electric devices, and a comparator which compare the output signal output from the device contactor with the expected pattern, said electric devices writing the data according to a write enabling signal and/or a chip selecting signal following a write command to write the data; and the test pattern including data to be written to at least one of the electric devices and the write enabling signal and/or the chip selecting signal which control behavior of the electric device, said tester comprising: a write command supply unit which supplies the write command to the plurality of the electric devices simultaneously; and a data writing control unit which consecutively enables a group of the electric devices to write the data by selectively activating the write enabling signals and/or the chip selecting signals supplied to the electric devices, wherein the pattern generating unit outputs the data sequentially after the write command is supplied to the plurality of the electric devices simultaneously.

This summary of the invention does not necessarily describe all necessary features so that the invention may also be a sub-combination of these described features.

BRIEF DESCRIPTION OF THE DRAWINGS

The above and other objects and features of the invention will become more apparent from the following detailed description of the preferred embodiments with reference to the attached drawings, wherein:

FIG. 5 is a figure to explain the count data bits selected by the counter selector relating to an embodiment of the present invention;

DETAILED DESCRIPTION OF THE PREFERRED EMBODIMENTS

The invention will now be described based on the preferred embodiments, which do not intend to limit the scope of the present invention, but exemplify the invention. All of the features and the combinations thereof described in the embodiment are not necessarily essential to the invention.

Figure 1:
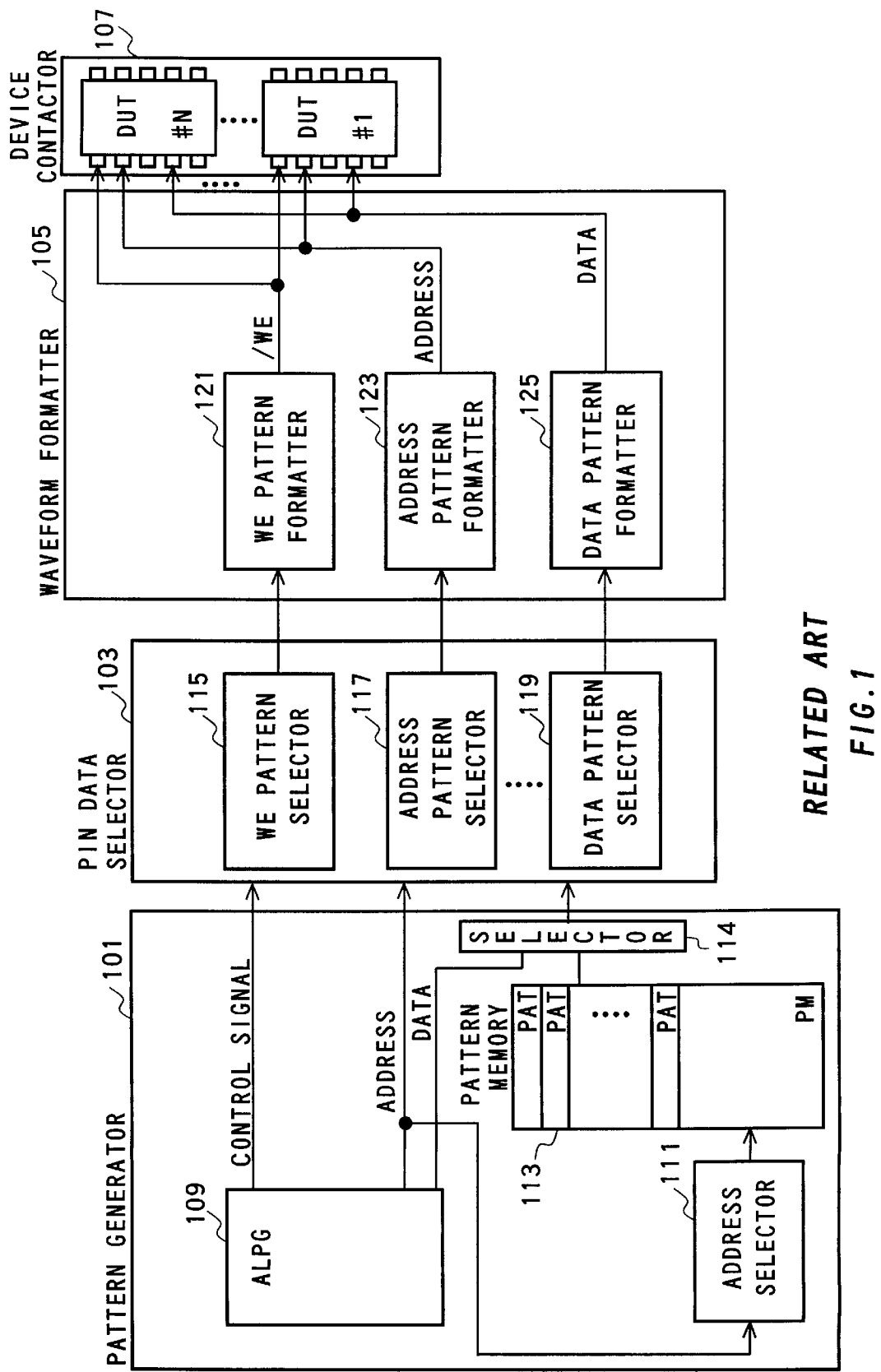
FIG. 1 illustrates the structure of a conventional tester.
Figure 2:
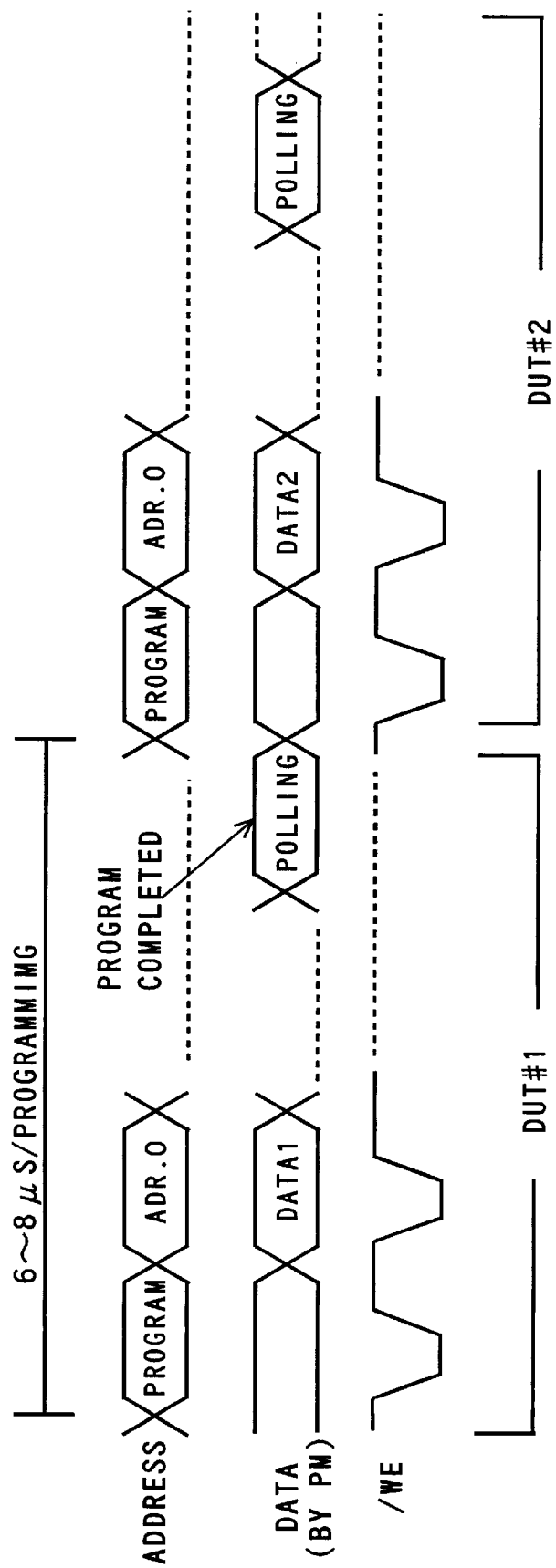
FIG. 2 is a timing chart when different data is written to each one of DUTs using the conventional tester.
Figure 3:
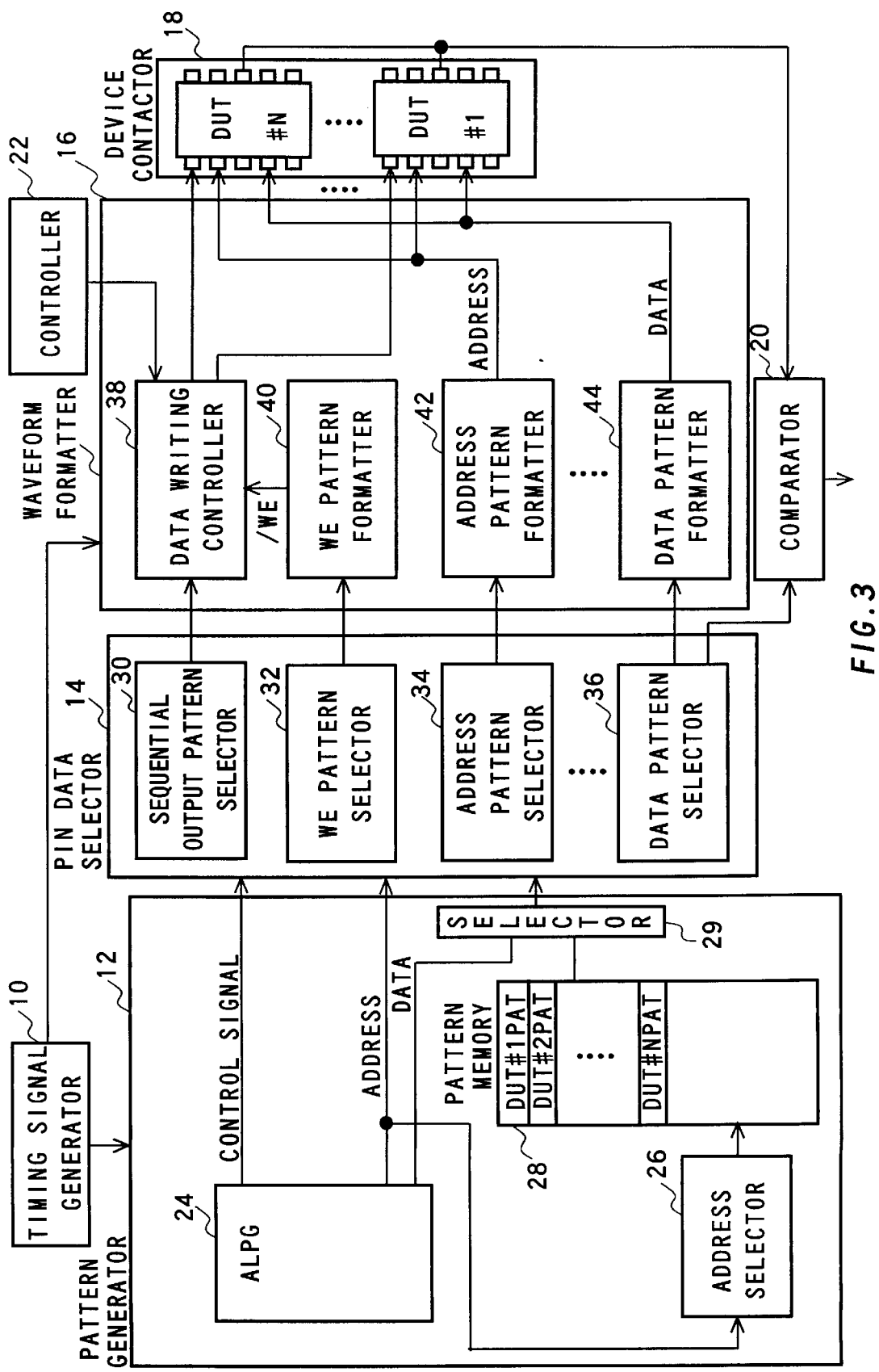
FIG. 3 illustrates the structure of a tester as an example of a data writing apparatus relating to an embodiment of the present invention.

FIG. 3 illustrates the structure of a tester as an example of a data writing apparatus according to an embodiment of the present invention. FIG. 3 is a tester which tests a plurality of the same DUTs, wherein the DUT is a flash memory as an example of electric devices, comprising a timing signal generator 10, a pattern generator 12, a pin data selector 14, a waveform formatter 16, a device contactor 18, a comparator 20 and a controller 22 as an example of the sequence number setting unit. As used herein, the term "electric devices" means any electric components which operate in a predefined manner according to electric current or voltage, including not only semiconductor devices comprising active elements, such as memory, IC (integrated-circuit), LSI (large-scale integrated circuit), but also electric components such as passive elements, various sensors and the like, and furthermore package components comprising these elements, and plated printed circuits such as breadboards where these elements are attached to perform required functions.

The timing signal generator 10 generates a base clock signal and outputs the base clock signal to the pattern generator 12 and the waveform formatter 16.

The pattern generator 12 is an example of the data generating unit and the sequential output pattern output unit, comprising an algorithmic pattern generator (ALPG) 24, an address selector 26 and a pattern memory (PM) 28 as an example of the data storing unit. The algorithmic pattern generator 24 outputs control signals and address signals which comprise parts of test patterns, according to a given rule. In the embodiment of the present invention, the algorithmic pattern generator 24 outputs the control signals and the address signals according to the base clock generated by the timing signal generator 10. The control signal can be, for instance, a WE pattern to enable DUTs to write data, a chip selecting (CS) pattern to activate DUTs and a sequential output pattern to sequentially output data to be written to at least one of a plurality of DUTs. In this embodiment of the invention, the value "1" of the sequential output pattern indicates that data is output sequentially. Furthermore, in this embodiment of the invention, DUT is activated when the CS pattern is "0", and if DUT is activated, DUT executes data writing process when the WE pattern is "0". In addition, the ALPG 24 itself can output data to be written to the DUTs.

The pattern memory 28 stores data which is part of a test pattern to be written to DUTs, and expected output data which is expected to be output from DUTs. The pattern memory 28 has data to be written to at least one of DUTs, as well as data to be written to a plurality of DUTs simultaneously. In this embodiment of the invention, the pattern memory 28 stores a data pattern to be written to DUT#1, a data pattern to be written to DUT#2, . . . , a data pattern to be written to DUT#N (N is any integer number). The pattern memory 28 outputs data corresponding to the address specified by the address selector 26.

The address selector 26 selects an address of the pattern memory 28 according to the address signal output from the algorithmic pattern generator 24. When the algorithmic pattern generator 24 generates the sequential output pattern whose value is "1", the address selector 26 enables the pattern memory 28 to output data to be written to at least one of DUTs sequentially. The selector 29 selects data either from the ALPG 24 or the pattern memory 28 and output the data to the pin data selector 14. In the embodiment where different data are written to each one of DUTs, the selector 29 selects data output from the pattern memory 28.

The pin data selector 14 comprises a sequential output pattern selector 30, a WE pattern selector 32, an address pattern selector 34 and a data pattern selector 36. Furthermore, in this embodiment of the invention, the pin data selector 14 may have other selectors which select patterns to be input to other pins of DUTs, as well as these pattern selectors. The pin data selector sets patterns output from the pattern generator 12 in accordance with the pin alignment of DUTs. The sequential output pattern selector 30 selects the sequential output pattern from the control signal generated by the pattern generator 12, and outputs the pattern to the waveform formatter 16. The WE pattern selector 32 selects the WE pattern from the control signal generated by the pattern generator 12, and outputs the pattern to the waveform formatter 16. The address pattern selector 34 selects the address pattern from the address signal generated by the pattern generator 12, and outputs the pattern to the waveform formatter 16. The data pattern selector 36 selects the data generated by the pattern memory 28 in the pattern generator 12, and outputs the data to the waveform formatter 16 and the comparator 20.

The waveform formatter 16 comprises a data writing controller 38, a WE pattern formatter 40, an address pattern formatter 42 as an example of the write command supply unit and a data pattern formatter 44 as an example of the parallel supply unit. The writing controller 38 controls for writing data to a plurality of DUTs which contact to the device contactor 18. WE pattern formatter 40 formats a WE pattern waveform into a given format and outputs the waveform to the data writing controller 38. The address pattern formatter 42 formats an address pattern waveform into a given format and outputs the waveform to the terminals of the device contactor 18 to which the pins of DUTs to receive the address pattern contact. The data pattern formatter 44 formats a data pattern waveform into a given format and outputs the waveform to the terminals of the device contactor 18 to which the pins of DUTs to receive the data pattern contact. Data can be thereby supplied in parallel to a plurality of DUTs.

The device contactor 18 enables each pattern formatted by the waveform formatter 16 to be input to the specific pins of a plurality of DUTs (DUT#1, . . . , DUT#N) which contact to said device contactor 18, and the data patterns output from the pins of a plurality of DUTs (DUT#1, . . . , DUT#N) to be output to a comparator 20.

The comparator 20 compares the data pattern which DUTs output via the device contactor 18, with the expected pattern output from the pattern memory 28 via the data pattern selector 36. Using this comparison, if the data patterns are equal to the expected patterns, the tester can determine the DUTs have no errors. The controller 22 controls the data writing controller 38. For instance, the controller 22 sets values to be stored in multiple registers 54A in multiple data writing control circuits 54 which are described later.

Figure 4:
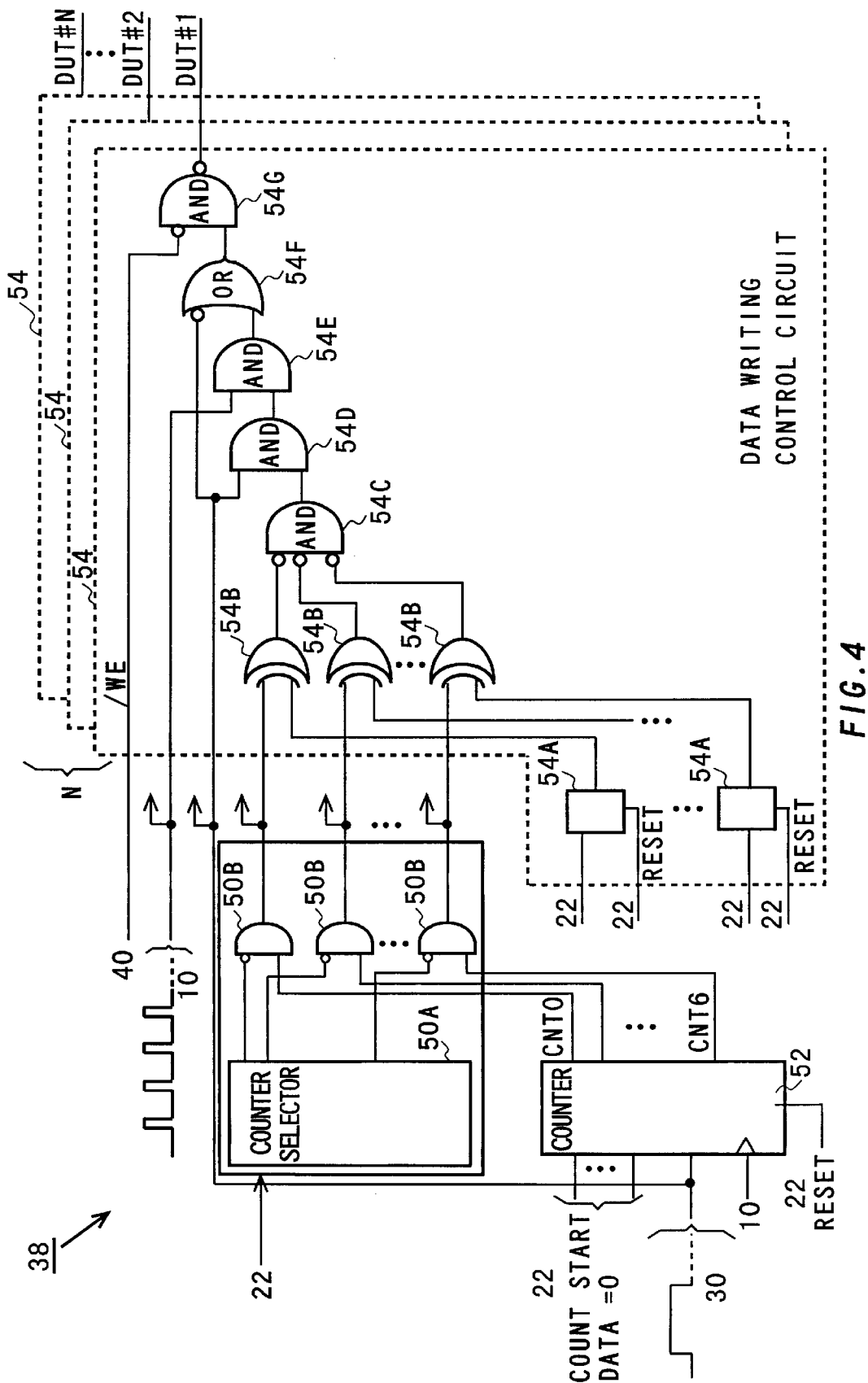
FIG. 4 illustrates the partial structure of a waveform formatter relating to an embodiment of the present invention.

FIG. 4 illustrates the partial structure of the waveform formatter related to an embodiment of the present invention. The present waveform formatter 16 comprises a counter 52, a counter selector 50 and a plurality of data writing control circuit 54 as an example of a data writing control unit.

The counter 52 counts times of data being output from the pattern generator 12 and outputs the count data. In the present embodiment, the counter 52 is a 7-bit binary counter. The counter 52 counts up based on the base clock from the timing signal generator 10 while the sequential output pattern is input from the pattern generator 12, and outputs the 7-bit count data from the lowest bit CNT0 to the highest bit CNT6. The counter 52 herein outputs "0" for the first data pattern, outputs "1" for the second data pattern and so on. Thus, the counter 52 outputs "127" (in decimal) for the 128th data pattern.

The counter selector 50 masks the bit patterns from the counter 52. FIG. 5 shows the bit information to be set in the counter selector controller 50A and the bit patterns from the counter 52 to be masked according to the number of DUTs which contact to the device contactor 18. If 8 DUTs contact to the device contactor 18, the four bits from CNT6 to CNT3 are masked. Likewise, if 16 DUTs contact to the device contactor 18, the three bits from CNT6 to CNT4 are masked. If 32 DUTs contact to the device contactor 18, the two bits from CNT6 to CNT5 are masked. If 64 DUTs contact to the device contactor 18, the CNT6 bit is masked. If 128 DUTs contact to the device contactor 18, none of bits are masked. Thus, the counter selector 50 can select any necessary bits in the count data output from the counter 52.

Referring to FIG. 4 again, each data writing control circuit 54 controls data writing for each one of DUTs. The data writing control circuit 54 comprises multiple registers 54A as an example of a data sequence number storing unit, multiple exclusive OR (EXOR) logic gates 54B, an AND gate 54C, an AND gate 54D, an AND gate 54E, an AND gate 54F and an AND gate 54G.

Multiple (for instance, seven) registers 54A store the sequence number indicating the DUT under the control of the data writing control circuit 54. In the present embodiment, each register 54A stores one bit information which corresponds to each digit of the binary data indicating the sequence number. For instance, if the sequence number is 1, all registers 54A store "0". For the sequence number 2, the register 54A corresponding to the lowest bit stores "1", and the other registers 54A store "0". The values of these registers 54A herein can be set by the controller 22.

Each exclusive OR (EXOR) gate 54B receives inputs from the AND gate 50B and the register 54A which correspond to the same digit in the count data. The EXOR gate 54B outputs the exclusive OR of the input data. Thus, each EXOR gate 54B corresponding to each digit in the count data outputs "0", if the bit data of the input data is the same, that is, the digit bit of the count data is equal to the digit bit of sequence number, and outputs "1" otherwise.

The AND gate 54C receives the negation of the data output from multiple EXOR gate 54B, and outputs the logical multiplication of the input data. Thus, the AND gate 54C outputs "1" if all input data from multiple EXOR gates 54B are "0", that is, the count data is equal to the sequence number.

The AND gate 54D receives the data output from the AND gate 54C and the sequential output pattern being output from the sequential output pattern selector 30, and outputs the logical multiplication of the input data. Thus, the AND gate 54D outputs "1" if the sequential output pattern are output and the count data is equal to the sequence number.

The AND gate 54E receives the data output from the AND gate 54D and the base clock output from the timing signal generator 10, and outputs the logical multiplication of the input data. Thus, the AND gate 54E outputs "1" according to the base clock, if the count data is equal to the sequence number.

The AND gate 54F receives the negation of the sequential output pattern being output from the sequential output pattern selector 30 and the data output from the AND gate 54E, and outputs the logical addition of the input data. Thus, the AND gate 54F outputs "1" if the sequential output pattern from the sequential output pattern selector 30 is "0" or the data from the AND gate 54E is "1".

The AND gate 54G receives the negation of the WE pattern output from the WE pattern formatter 40 and the data output from the AND gate 54F, and outputs the negation of the logical multiplication of the input data to the corresponding DUT. Thus, if the sequential output pattern is "0", the AND gate 54G outputs the WE pattern "0" as it is, to the corresponding DUT. If the sequential output pattern is "1" and the count data is equal to the sequence number, the AND gate 54G outputs the WE pattern "0" to the corresponding DUT and enables the DUT to write the data pattern.

Figure 6:
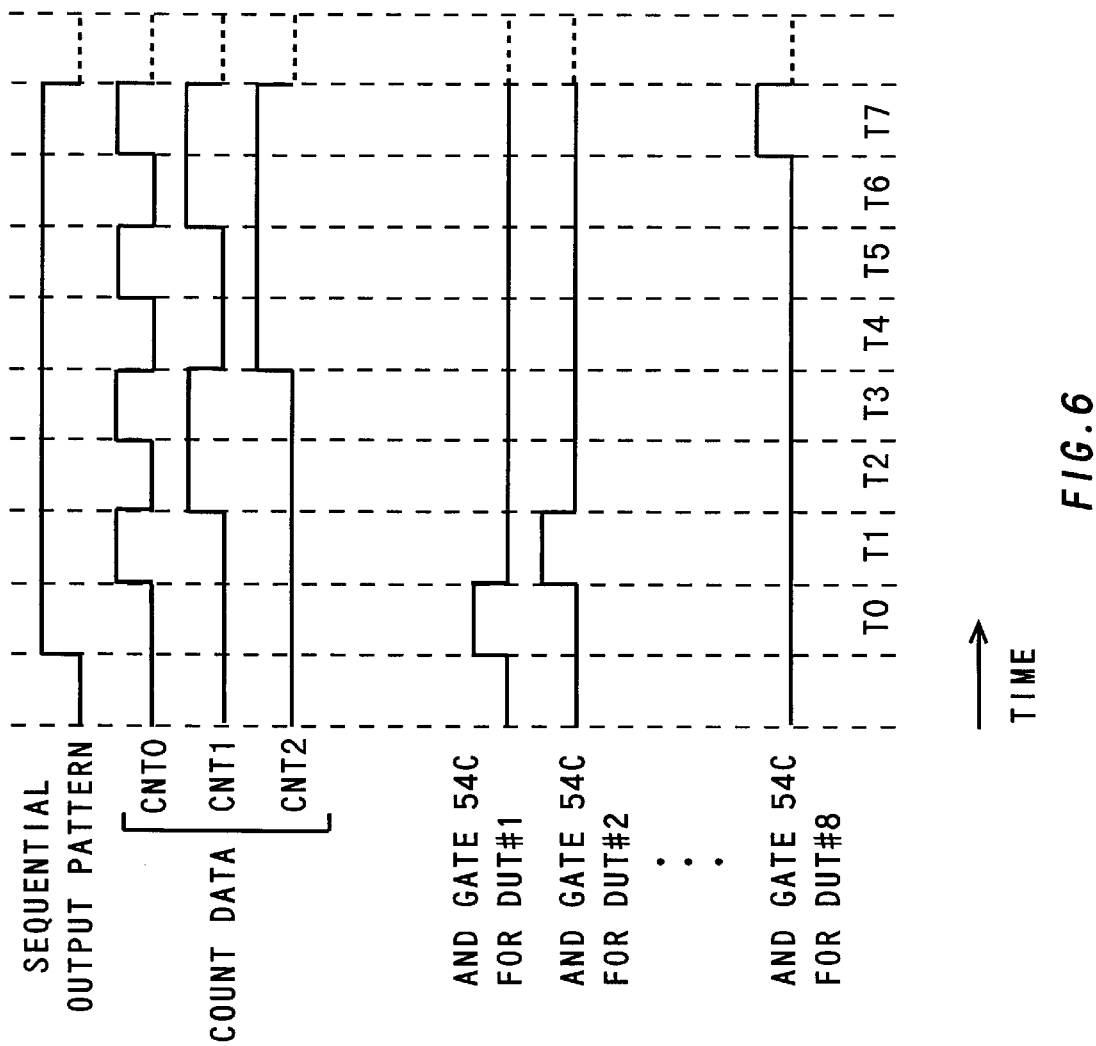
FIG. 6 is an example of the signal timing chart when data is written to 8 DUTs in the tester relating to an embodiment of the present invention.

FIG. 6 is an example of the timing chart of signals when data is written into eight DUTs in the tester of an embodiment of the present invention. Three of registers 54A in the data writing control circuit 54 are used to store the lower three bit of the sequence number, and other registers stores "0", and the counter selector 50 masks the upper four bits of the counter 52. The three registers of the data writing control circuit for DUT#1 stores "000" representing the first sequence number. For DUT#2, DUT#3, . . . , DUT#8, the registers stores "001", "010", . . . , "111" respectively.

At time T0, the sequential output pattern is input, and the counter 52 starts to count up. Then the three EXOR gates 54B in the data writing control circuit 54 receives "000" as the count data. The three EXOR gates 54B only for DUT#1 receives "000" representing the sequence number from the registers 54A and each of said three EXOR gates outputs "0" respectively. As a result, as for the DUT#1, the AND gate 54C outputs "1", the AND gate 54D outputs "1", the AND gate 54E outputs "1", the AND gate 54F outputs "1", and the AND gate 54G outputs the WE pattern "0" output from the WE pattern formatter 40.

Likewise, at time T1, the AND gate 54G for DUT#2 outputs the WE pattern "0" output from the WE pattern formatter 40. At the time T2, T3, . . . , T7, the AND gates 54G for DUT#3, DUT#4, . . . , DUT#8 output the WE pattern "0" output from the WE pattern formatter 40 respectively. Thus, when the data generated from the pattern generator 12 is the data to be written to a specific DUT, the data writing controller 38 can output the WE pattern "0" only to said DUT.

Figure 7:
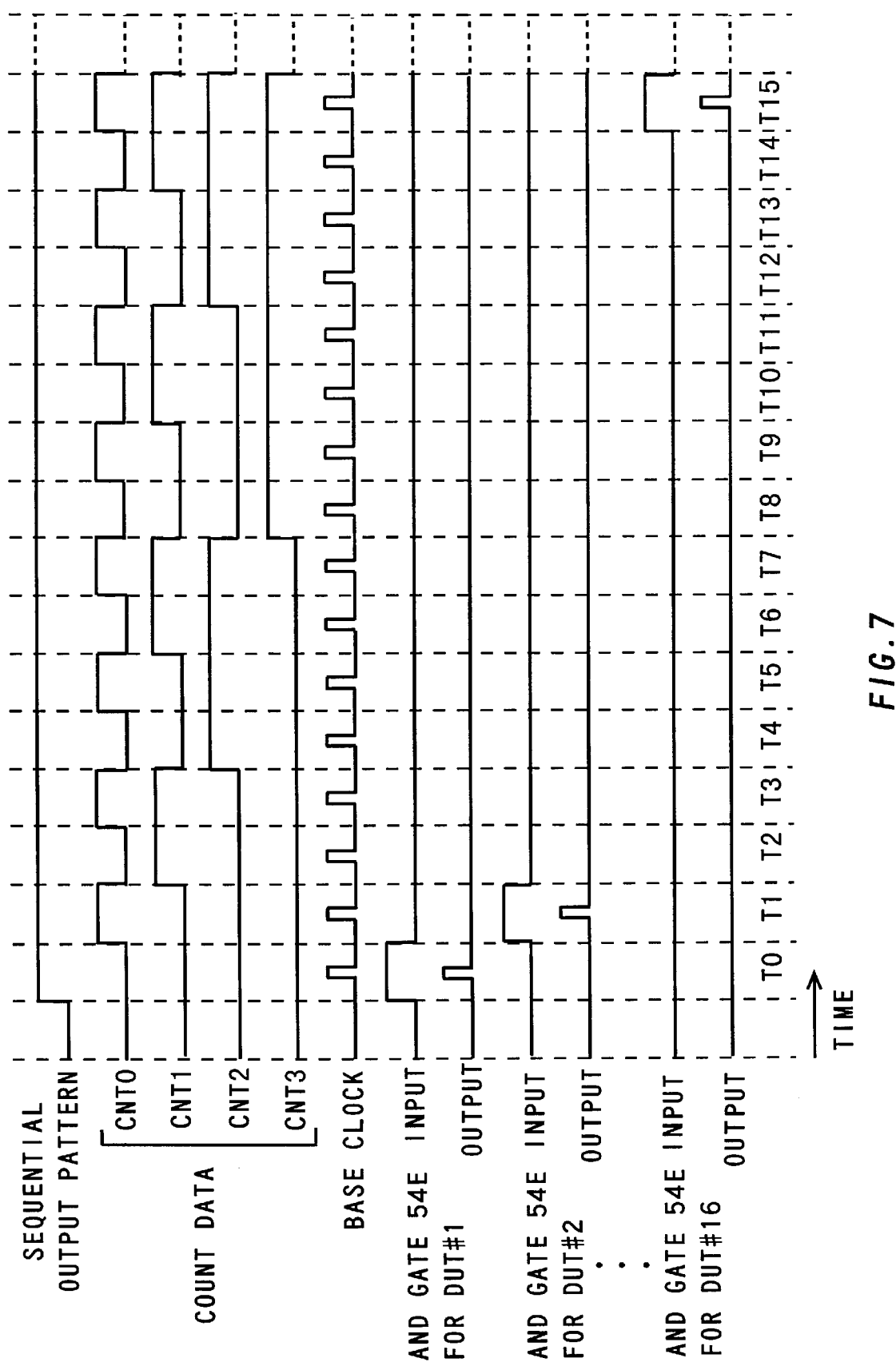
FIG. 7 is an example of the signal timing chart when data is written to 16 DUTs in the tester relating to an embodiment of the present invention.

FIG. 7 is an example of the timing chart of signals when data is written into 16 DUTs in the tester of an embodiment of the present invention. Four of registers 54A in the data writing control circuit 54 are used to store the lower four bit of the sequence number information, and other registers stores "0", and the counter selector 50 masks the upper three bits of the counter 52. The four registers of the data writing control circuit for DUT#1 stores "0000" representing the first sequence number. For DUT#2, DUT#3, . . . , DUT#8, the registers stores "0001", "0010", . . . , "1111" respectively.

At time T0, the sequential output pattern is input, and the counter 52 starts to count up. Then the four EXOR gates 54B in the data writing control circuit 54 receives "0000" as the count data. The four EXOR gates 54B only for DUT#1 receives "0000" representing the sequence number from the registers 54A and each of said four EXOR gates outputs "0" respectively. As a result, as for the DUT#1, the AND gate 54C outputs "1" and the AND gate 54D outputs "1" to the AND gate 54E. The AND gate 54E outputs the base clock output from the timing signal generator 10 when receiving "1" from the AND gate 54D. Then, the AND gate 54F outputs said base clock as it is, and the AND gate 54G outputs the WE pattern "0" output from the WE pattern formatter 40, according to said base clock.

Likewise, at time T1, the AND gate 54E for the DUT#2 outputs the base clock output from the timing signal generator 10 when receiving "1" from 54D. Then, the AND gate 54F outputs said base clock as it is, and the AND gate 54G outputs the WE pattern "0" output from the WE pattern formatter 40, according to said base clock. At the time T2, T3, . . . , T15, the AND gate 54E for the DUT#3, DUT#4, . . . , DUT#15 outputs the base clock output from the timing signal generator 10 when receiving "1" from the AND gate 54D respectively. Then, the AND gate 54F outputs said base clock as it is, and the AND gate 54G outputs the WE pattern "0" output from the WE pattern formatter 40, according to said base clock. Thus, when the data generated from the pattern generator 12 is the data to be written to a specific DUT, the data writing control unit 38 can output the WE pattern "0" only to said DUT.

Figure 8:
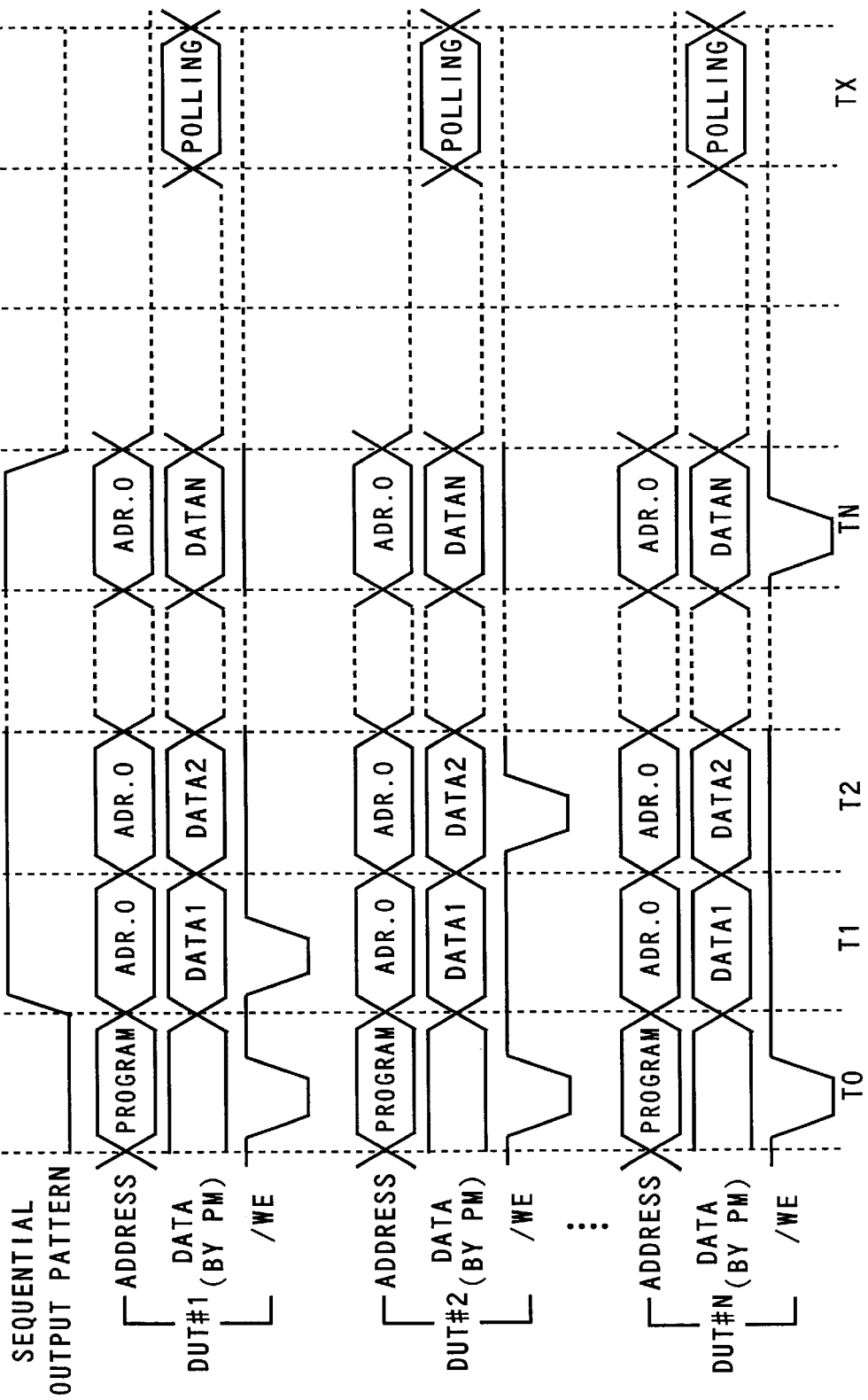
FIG. 8 is an example of the timing chart of signal given to each DUT when data is written to N DUTs in the tester relating to an embodiment of the present invention.

FIG. 8 is an example of the timing chart of signals given to each DUT when data is written into N DUTs in the tester of an embodiment of the present invention. The pattern generator 12 herein outputs a program command to direct the DUTs to write data at time T0, and outputs the address of the DUTs (ADR.0) to which data is written at time T1, T2, . . . , TN.

The pattern generator 12 generates from the pattern memory 28 a data pattern such as data1 to be written to DUT#1 at time T1, and data2 to be written to DUT#2 at time T2. Likewise, the pattern generator 12 generates data3, data4, . . . , dataN from the pattern memory 28 at time T3, . . . , TN respectively, and generates a polling signal to confirm the data writing at time TX. The pattern generator 12 also outputs WE patterns "0" at time T0, T1, T2, . . . , TN, and outputs a sequential output pattern "1" at T1, T2, . . . , TN.

The plural registers 54A in the data writing control circuit 54 for the DUT#1 store the sequence number information indicating the first data must be written. Likewise, the plural registers 54A in the data writing control circuit 54 for the DUT#2, DUT#3, . . . , DUT#N stores the sequence number information indicating the second, third, . . . , Nth data must be written respectively.

As described above, when the pattern generator 12 starts to generate a test pattern, a program command as an address pattern and a WE pattern "0" are input to the DUT#1, . . . , DUT#N at time T0. The DUT#1, . . . , DUT#N hereby understand that data writing process must be started.

At time T1, address data (ADR.0) as an address pattern and DATA1 as an data pattern are supplied to the DUT#1, . . . , DUT#N. As explained in FIG. 6 and FIG. 7, WE pattern "0" output from the pattern generator 12 is input to the DUT#1 notifying that there is a data to be written, while WE pattern "1" are input to the other DUTs. As a result, DUT#1 starts to write the supplied DATA1 to the specified address, while the other DUTs do not start any writing process. Thus, DATA1 is written only to the DUT#1.

At time T2, address data (ADR.0) as an address pattern and DATA2 as an data pattern are supplied to the DUT#1, . . . , DUT#N. As explained in FIG. 6 and FIG. 7, WE pattern "0" output from the pattern generator 12 is input to the DUT#2 notifying that there is a data to be written, while WE pattern "1" are input to the other DUTs. As a result, DUT#2 starts to write the supplied DATA2 to the specified address, while the other DUTs do not start any writing process. Thus, DATA2 is written only to the DUT#2. Likewise, At time T3, . . . , TN, DUT#3, . . . , DUT#N start to write DATA3, . . . , DATAN respectively. Thus the different data can be written to the different DUTs.

As described above, the present invention enables to write different data to any one of the plural DUTs easily and at a low cost without or with enforcing any changes to the resources of the tester, such as the pattern memory 28, the device contactor 18 and the like. In general, the process of testing electric devices and the process of storing the identification information to electric devices is executed before said electric devices are delivered. If these process are executed by the tester of the present invention, the device contactor can be shared by a plurality of DUTs and it is not necessary to exchange the DUTs which contact to the device contactor. As a result, it is possible to test the electric devices and write the identification information to the electric devices in a short time.

The present invention is not limited to the above embodiment and various alteration can be made. For instance, in the above embodiment, different data is written to each one of DUTs, but the present invention is not limited to the embodiment. For instance, the same data can be written to any number of the plural DUTs. In the above embodiment, the data writing controller 38 control data writing process to the DUTs by controlling WE patterns, but the present invention is not limited to the embodiment. The data writing controller 38 can output a CS pattern to each DUT and control data writing by changing the CS pattern to control each DUT's behavior. All needed is to control data writing to DUTs in some ways. In the above embodiment, a flash memory is used as an example of electric devices, but the present invention is not limited to the embodiment. For instance, the electric device can be a electric device comprising data memories (ROM, RAM) which can retain written data. The electric devices comprising data memories can be ROM, RAM, IC and CPU and the like.

As clearly understood from the above explanation, the present invention enables to write different data to a plurality of electric devices easily and in a short time.

Although the present invention has been described by way of exemplary embodiments, it should be understood that many changes and substitutions may be made by those skilled in the art without departing from the spirit and the scope of the present invention which is defined only by the appended claims.

What is claimed is:

1. A data writing apparatus for writing data to a plurality of electric devices, comprising:

a data storing unit which stores a plurality of said data to be written to at least one of said electric devices;

a data generating unit which outputs said plurality of said data sequentially from said data storing unit;

a data sequence number storing unit which stores sequence numbers, each indicating at least one of said electric devices;

a counter which counts times of said data being output sequentially from said data generating unit; and a data writing control unit which enables said one of said electric devices indicated by said sequence number that is equal to said times, to write said data.

2. A data writing apparatus as claimed in claim 1, further comprising a sequence number setting unit which sets said sequence number to said data sequence number storing unit.

3. A data writing apparatus as claimed in claim 1, wherein:

said data generating unit outputs said data sequentially according to a given base clock; and said counter counts times of said data being output sequentially according to said base clock.

4. A data writing apparatus as claimed in claim 3, further comprising a sequential output pattern output unit which outputs a sequential output pattern indicating whether to write each of said data to one of said electric devices or to all of said electric devices, wherein said counter counts times of said data when said sequential output pattern indicates that said data is output sequentially.

5. A data writing apparatus as claimed in claim 1, further comprising a parallel supply unit which supplies said data to said plurality of said electric devices in parallel.

6. A data writing apparatus as claimed in claim 1, wherein said electric device has a nonvolatile data memory which retains written data.

7. A data writing apparatus as claimed in claim 6, wherein said nonvolatile data memory is a flash memory.

8. A data writing apparatus as claimed in claim 6, wherein:

said plurality of said electric devices input a write enabling signal; and said data writing control unit activates said write enabling signal supplied to said one of said electric devices indicated by said sequence number that is equal to said times, and enables said one of said electric devices to write said data.

9. A data writing apparatus as claimed in claim 6, wherein:

said plurality of said electric devices input a chip selecting signal; and said data writing control unit activates said chip selecting signal supplied to said one of said electric devices indicated by said sequence number that is equal to said times, and enables said one of said electric devices to write said data.

10. A data writing apparatus for writing data to a plurality of electric devices, according to a write enabling signal and/or a chip selecting signal following a write command to write said data, comprising:

a data storing unit which stores a plurality of said data;

a write command supply unit which supplies said write command to said plurality of said electric devices simultaneously;

a data generating unit which outputs said data sequentially from said data storing unit, after said write command is supplied to said plurality of said electric devices;

a data writing control unit which consecutively enables a group of said electric devices to write said data by selectively activating said write enabling signals and/or said chip selecting signals supplied to said group of said electric devices.

11. A data writing method for writing data to a plurality of electric devices, comprising:

sequentially generating data to be written to at least one of said electric devices;

storing sequence numbers, each indicating at least one of said electric devices;

counting times of said data generated sequentially; and writing said data to said one of said electric devices indicated by said sequence number that is equal to said times.

12. A tester having a pattern generating unit which generates a test pattern to be input to a plurality of electric devices and an expected pattern to be output from said plurality of said electric devices, a pin data selector which sets said test pattern generated from said pattern generating unit in accordance with pin alignment of electric terminals of said electric devices, a waveform formatter which formats said test pattern output from said pin data selector, a device contactor which provides said test pattern formatted by said waveform formatter to said plurality of said electric devices and receives an output signal from said plurality of said electric devices, and a comparator which compares said output signal output from said device contactor with said expected pattern, said test pattern including data to be written to at least one of said electric devices and a control signal which controls behavior of said electric device, said pattern generating unit outputting said test patterns sequentially, said tester comprising:

a data sequence number storing unit which stores sequence numbers, each indicating at least one of said electric devices;

a counter which counts times of said data being output sequentially from said pattern generating unit; and a data writing control unit which enables said one of said electric devices indicated by said sequence number that is equal to said times, to write said data.

13. A tester as claimed in claim 12, further comprising a sequence number setting unit which sets said sequence number to said data sequence number storing unit.

14. A tester as claimed in claim 12, wherein:

said pattern generating unit outputs said data sequentially according to a given base clock; and said counter counts times of said data being output sequentially according to said base clock.

15. A tester as claimed in claim 14, further comprising:

a sequential output pattern output unit which outputs a sequential output pattern indicating whether to write each of said data to one of said electric devices or to all of said electric devices, wherein said counter counts times of said data when said sequential output pattern indicates that said data is output sequentially.

16. A tester as claimed in claim 12, further comprising a parallel supply unit which supplies said data in said test pattern to said plurality of said electric devices in parallel.

17. A tester as claimed in claim 12, wherein said electric device has a nonvolatile data memory which retains written data.

18. A tester as claimed in claim 17, wherein said nonvolatile data memory is a flash memory.

19. A tester as claimed in claim 17, wherein said test pattern includes a plurality of write enabling signals, each of which is supplied to one of said electric devices; and said data writing control unit activates said write enabling signal that is supplied to said electric device indicated by said sequence number that is equal to said times, and enables said electric device to write said data.

20. A tester as claimed in claim 17, wherein said test pattern includes a plurality of chip selecting signals, each of which is supplied to one of said electric devices; and said data writing control unit activates said chip selecting signal that is supplied to said electric device indicated by said sequence number that is equal to said times, and enables said electric device to write said data.

21. A tester having a pattern generating unit which generates a test pattern to be input to a plurality of electric devices and an expected pattern to be output from said plurality of said electric devices, a pin data selector which sets said test pattern generated from said pattern generating unit in accordance with pin alignment of electric terminals of said electric devices, a waveform formatter which formats said test pattern output from said pin data selector, a device contactor which provides said test pattern formatted by said waveform formatter to said plurality of said electric devices and receives an output signal from said plurality of said electric devices, and a comparator which compares said output signal output from said device contactor with said expected pattern, said electric device writing said data according to a write enabling signal and/or a chip selecting signal following a write command to write said data; and said test pattern including data to be written to at least one of said electric devices and said write enabling signal and/or said chip selecting signal which control behavior of said electric device, said tester comprising:

a write command supply unit which supplies said write command to said plurality of said electric devices simultaneously; and a data writing control unit which consecutively enables a group of said electric devices to write said data by selectively activating said write enabling signals and/or said chip selecting signals supplied to said electric devices, wherein said pattern generating unit outputs said data sequentially after said write command is supplied to said plurality of said electric devices simultaneously.

* * * * *